(12) United States Patent
Moriya et al.

(10) Patent No.: US 8,481,983 B2
(45) Date of Patent: Jul. 9, 2013

(54) EXTREME ULTRA VIOLET LIGHT SOURCE APPARATUS

(75) Inventors: Masato Moriya, Hiratsuka (JP); Hiroshi Komori, Hiratsuka (JP); Takeshi Asayama, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 163 days.

(21) Appl. No.: 12/385,245

(22) Filed: Apr. 2, 2009

(65) Prior Publication Data
US 2009/0250641 A1 Oct. 8, 2009

(30) Foreign Application Priority Data

Apr. 7, 2008 (JP) ................................. 2008-099406

(51) Int. Cl.
*G21K 5/04* (2006.01)
(52) U.S. Cl.
USPC ................................... 250/504 R; 250/493.1
(58) Field of Classification Search
USPC ... 250/493.1, 494.1, 503.1, 504 R; 315/111.01, 315/111.11, 111.21, 111.41, 111.71
See application file for complete search history.

(56) References Cited

U.S. PATENT DOCUMENTS

| | | | | |
|---|---|---|---|---|
| 4,042,848 A | * | 8/1977 | Lee | 376/145 |
| 2003/0006383 A1 | * | 1/2003 | Melnychuk et al. | 250/504 R |
| 2005/0167618 A1 | * | 8/2005 | Hoshino et al. | 250/504 R |
| 2006/0249699 A1 | * | 11/2006 | Bowering et al. | 250/504 R |
| 2007/0235666 A1 | * | 10/2007 | Ruzic et al. | 250/504 R |
| 2008/0099699 A1 | * | 5/2008 | Yabuta et al. | 250/504 R |

FOREIGN PATENT DOCUMENTS

| | | |
|---|---|---|
| JP | 2005-197456 | 7/2005 |
| JP | 2006-080255 | 3/2006 |
| JP | 2006-202671 | 8/2006 |
| JP | 2006-210157 | 8/2006 |
| JP | 2007-220949 | 8/2007 |

OTHER PUBLICATIONS

Japanese Office Action, w/ partial English translation thereof, issued in Japanese Patent Application No. 2008-099406, dated Apr. 17, 2012.

* cited by examiner

*Primary Examiner* — Nicole Ippolito
(74) *Attorney, Agent, or Firm* — McDermott Will & Emery LLP

(57) ABSTRACT

An extreme ultra violet light source apparatus in which debris moving within a chamber are prevented from reducing reflectance or transmittance of optical elements of an EUV collector mirror, etc., and extreme ultra violet light can stably be generated in a long period. The apparatus includes: a target supply unit for supplying a target to a predetermined position within a chamber; a driver laser for applying a laser beam to the target to generate first plasma; a collector mirror provided within the chamber, for collecting extreme ultra violet light radiated from the first plasma; a gas supply unit for supplying a gas into the chamber; an excitation unit for exciting the gas to generate second plasma around a region where the first plasma is generated; and an exhaust unit for exhausting the chamber and ejecting debris emitted from the first plasma to outside of the chamber.

12 Claims, 5 Drawing Sheets

EXTREME ULTRA VIOLET LIGHT SOURCE APPARATUS

BACKGROUND OF THE INVENTION

1. Field of the Invention

The present invention relates to an extreme ultra violet (EUV) light source apparatus to be used as a light source of exposure equipment.

2. Description of a Related Art

Recent years, as semiconductor processes become finer, photolithography has been making rapid progress to finer fabrication. In the next generation, microfabrication of 100 nm to 70 nm, further, microfabrication of 50 nm or less will be required. Accordingly, in order to fulfill the requirement for microfabrication of 50 nm or less, for example, exposure equipment is expected to be developed by combining an EUV light source generating EUV light having a wavelength of about 13 nm and reduced projection reflective optics.

As the EUV light source, there are three kinds of light sources, which include an LPP (laser produced plasma) light source using plasma generated by applying a laser beam to a target (hereinafter, also referred to as "LPP type EUV light source apparatus"), a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that light emission of only the necessary waveband can be performed by selecting the target material, and that an extremely large collection solid angle of $2\pi$ steradian can be ensured because it is a point light source having substantially isotropic angle distribution and there is no structure surrounding the light source such as electrodes. Therefore, the LPP light source is considered to be predominant as a light source for EUV lithography requiring power of more than several tens of watts.

Here, a principle of generating EUV light in the LPP type EUV light source apparatus will be explained. When a laser beam is applied to a target material supplied into a vacuum chamber, the target material is excited and plasmarized. Various wavelength components including EUV light are radiated from the plasma. Then, the EUV light is reflected and collected by using an EUV collector mirror that selectively reflects a desired wavelength component (e.g., a component having a wavelength of 13.5 nm), and outputted to an exposure unit.

Figure 5:
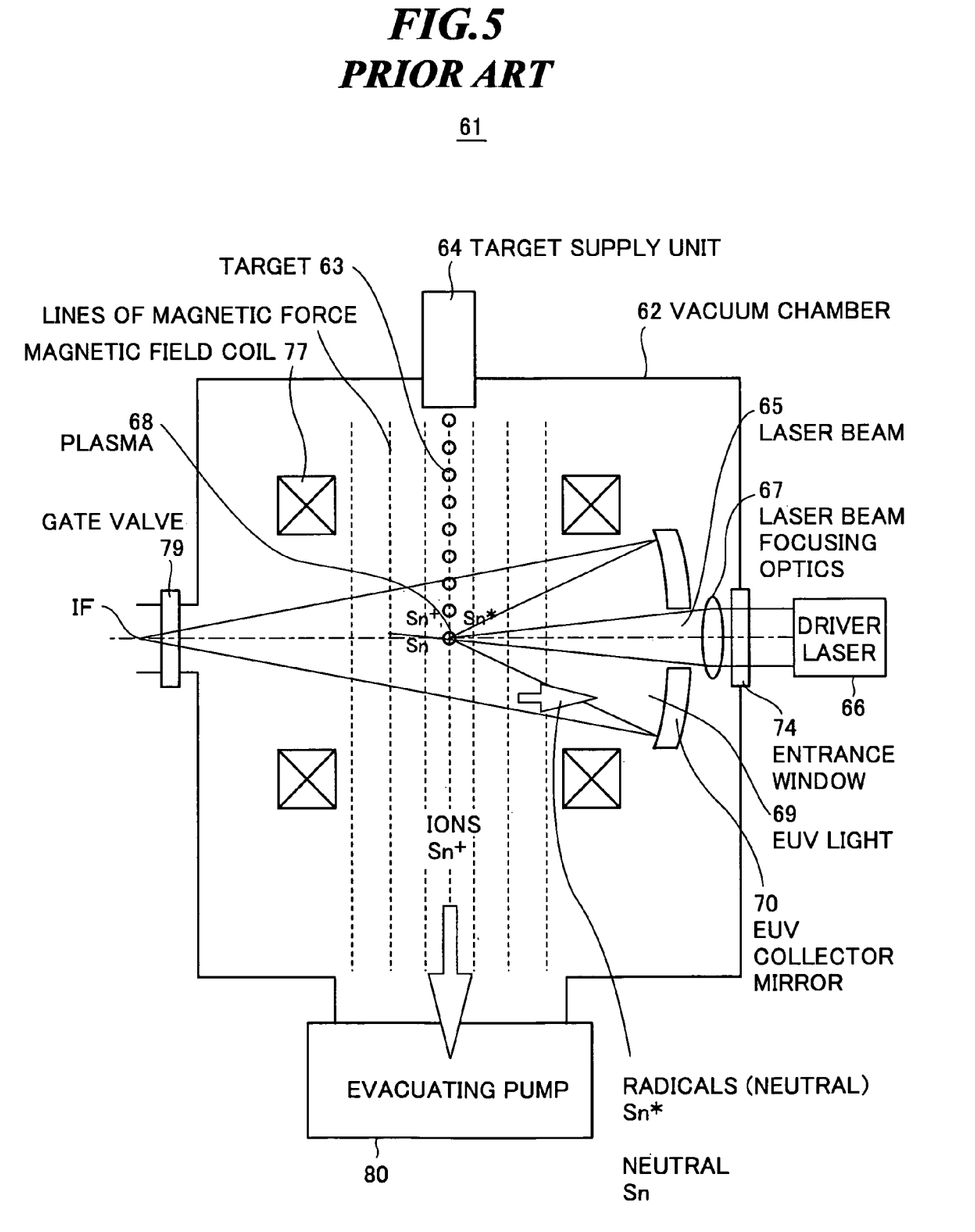
FIG. 5 shows an internal structure of a conventional EUV light source apparatus.

FIG. 5 shows an example of the conventional EUV light source apparatus. As shown in FIG. 5, the EUV light source apparatus 61 includes a vacuum chamber 62 in which EUV light is generated, a target supply unit 64 for supplying a target 63 to a predetermined position within the vacuum chamber 62, a driver laser 66 for generating an excitation laser beam 65 to be applied to the target 63, a laser beam focusing optics 67 for focusing the excitation laser beam 65 generated by the driver laser 66, and an EUV collector mirror 70 for collecting and outputting EUV light 69 emitted from plasma 68 generated when the excitation laser beam 65 is applied to the target 63, a magnetic field generating unit including a magnetic field coil 77 for generating a magnetic field that confines ionized debris included in debris generated from the plasma 68, and an evacuating pump 80 for evacuating the vacuum chamber 62.

In the LPP type EUV light source apparatus, there is a problem that the debris emitted from the plasma 68 attach to the surfaces of the optical elements of the EUV collector mirror 70, the laser beam focusing optics 67, a laser beam entrance window 74, an SPF (spectral purity filter) (not shown), an entrance window of an optical sensor (not shown), and so on, and reduce the reflectance or transmittance of EUV light, and thereby, reduce the output of EUV light and/or sensitivity of the sensor. In order to solve the problem, a technology of confining and ejecting the ionized debris generated from plasma by using a magnetic field to the outside of the vacuum chamber is known (Japanese Patent Application Publication JP-P2005-197456A). The debris refers to flying materials from plasma including neutral particles and ions and waste target materials.

For example, when the tin metal target 63 is excited by the excitation laser beam 65, most of tin becomes plasma 68 including polyvalent positive ions and electrons. When a magnetic field is applied to the region including the plasma 68 by the magnetic field coil 77, the positive tin ions are constrained by the magnetic field and moved in a direction along lines of magnetic force. Thereby, the amount of the positive tin ions attaching to the optical elements of the EUV collector mirror 70, the laser beam focusing optics 67, the laser beam entrance window 74, the SPF (not shown), the entrance window of the optical sensor (not shown), and so on is reduced, and the positive tin ions are efficiently ejected to the outside of the vacuum chamber 62 by the evacuating pump 80.

JP-P2005-197456A discloses protection of the EUV collector mirror by trapping the ionized debris included in the debris generated from the plasma by using the magnetic field within the vacuum chamber of the EUV light source apparatus.

Further, Japanese Patent Application Publication JP-P2006-210157A discloses generation of EUV light by cooling and pressurizing tin hydride ($SnH_4$) to release the tin hydride in droplets or liquid jet and plasmarizing the tin hydride by using a laser beam.

As explained above, in the conventional LPP type EUV light source apparatus, since the ionized debris are constrained by the magnetic field and moved in the direction of lines of magnetic force and efficiently ejected by the evacuating pump, the ionized debris can be prevented from attaching to the optical elements within the chamber to deteriorate the performance of the EUV light source apparatus.

However, part of the generated positive ions recombine with electrons and become neutral particles, move without being constrained by the magnetic field, and attach to the surfaces of the optical elements within the chamber to reduce the reflectance and transmittance of EUV light, and thereby, reduce the performance of the EUV light source apparatus. Especially, polyvalent positive ions of tin or the like easily recombine with electrons and reduce the performance of the EUV light source apparatus.

Further, it is difficult to ionize all target materials by the excitation laser, and part of the target materials become neutral debris, move without being constrained by the magnetic field, and attach to the optical elements within the chamber to reduce the reflectance or transmittance of EUV light, and thereby, reduce the performance of the EUV light source apparatus.

SUMMARY OF THE INVENTION

The present invention has been achieved in view of the above-mentioned circumstances. A purpose of the present invention is to provide an extreme ultra violet light source apparatus in which debris moving within a chamber are prevented from reducing reflectance or transmittance of optical elements of an EUV collector mirror and so on, and extreme ultra violet light can stably be generated in a long period.

In order to accomplish the above-mentioned purpose, an extreme ultra violet light source apparatus according to one aspect of the present invention is an apparatus for generating extreme ultra violet light by applying a laser beam to a target, including: a chamber in which extreme ultra violet light is generated; a target supply unit for supplying a target to a predetermined position within the chamber; a driver laser for applying a laser beam to the target supplied by the target supply unit to generate first plasma; a collector mirror provided within the chamber, for collecting the extreme ultra violet light radiated from the first plasma to output the extreme ultra violet light; a gas supply unit for supplying a gas into the chamber; an excitation unit for exciting the gas supplied by the gas supply unit to generate second plasma around a region where the first plasma is generated; and an exhaust unit for exhausting the chamber and ejecting debris emitted from the first plasma to outside of the chamber.

According to the one aspect of the present invention, the gas is supplied into the chamber of the ultra violet light source apparatus and excited to generate the second plasma around the region where the first plasma, and the debris emitted from the first plasma are gasified and ejected to the outside of the chamber, and therefore, the debris are prevented from attaching to the optical elements within the chamber. Thereby, the debris moving within the chamber are prevented from reducing reflectance or transmittance of the optical elements of the EUV collector mirror and so on, and extreme ultra violet light can stably be generated in a long period.

DESCRIPTION OF THE PREFERRED EMBODIMENTS

Hereinafter, preferred embodiments of the present invention will be explained in detail by referring to the drawings. The same reference characters are assigned to the same component elements and the description thereof will be omitted.

Figure 1:
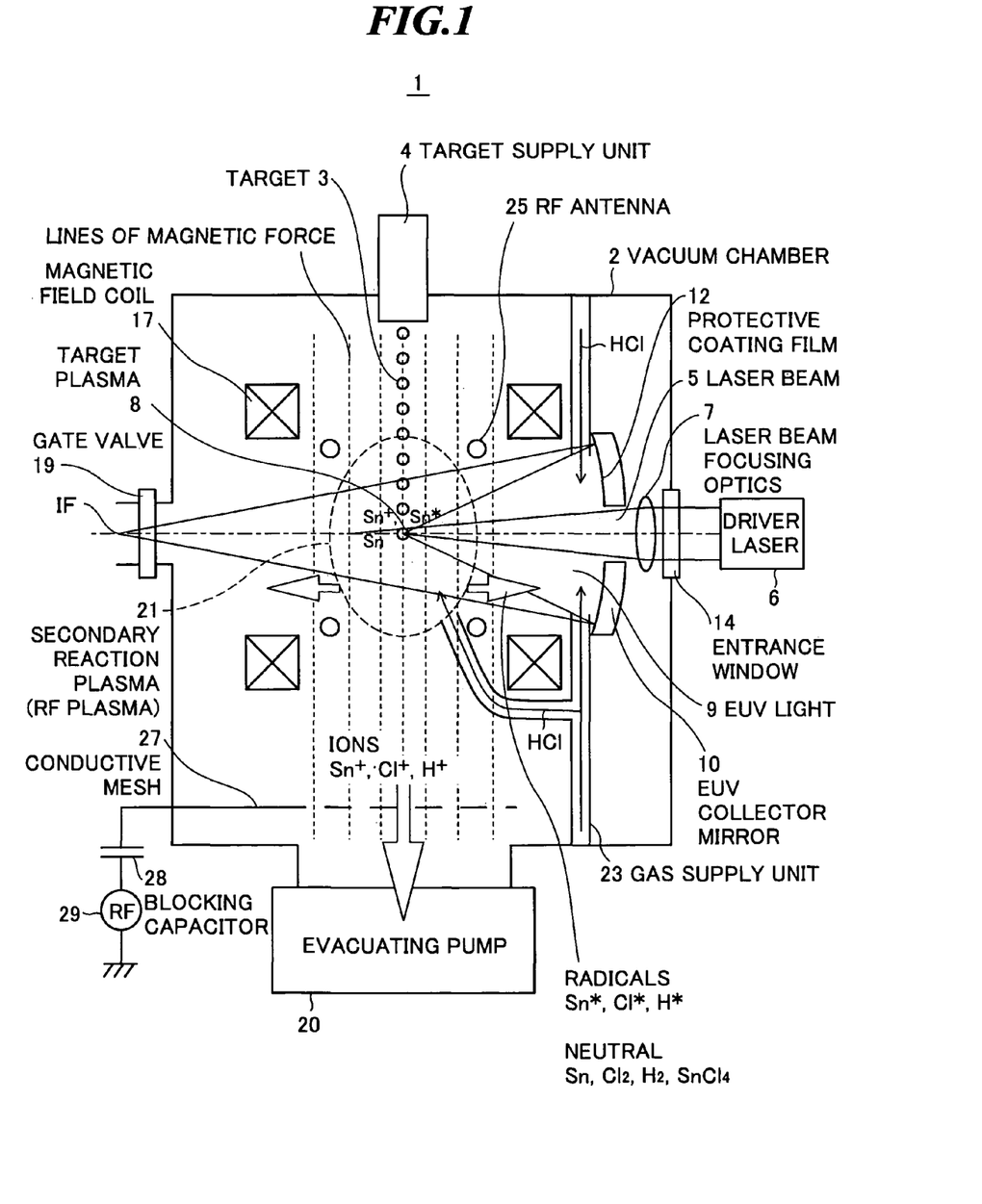
FIG. 1 shows an internal structure of an EUV light source apparatus according to the first embodiment of the present invention.

FIG. 1 is a schematic diagram showing an extreme ultra violet (EUV) light source apparatus according to the first embodiment of the present invention. The EUV light source apparatus employs a laser produced plasma (LPP) type and is used as a light source of exposure equipment.

As shown in FIG. 1, the EUV light source apparatus 1 includes a vacuum chamber 2 in which EUV light is generated, a target supply unit 4 for supplying a target 3 to a predetermined position within the vacuum chamber 2, a driver laser 6 for generating an excitation laser beam 5 to be applied to the target 3, a laser beam focusing optics 7 for focusing the excitation laser beam 5 generated by the driver laser 6, an EUV collector mirror 10 for collecting and outputting EUV light 9 emitted from plasma 8 (hereinafter, also referred to as "target plasma") generated when the excitation laser beam 5 is applied to the target 3, a magnetic field generating unit including a magnetic field coil 17 for generating a magnetic field that confines ionized debris included in debris generated from the plasma 8, and an evacuating pump 20 for evacuating the vacuum chamber 2.

Further, in order to generate plasma 21 (hereinafter, also referred to as "secondary reaction plasma") for ionizing electrically neutral debris of the debris generated from the plasma 8, the EUV light source apparatus 1 includes a gas supply unit 23 for supplying a gas for secondary reaction plasma, and an RF (radio frequency) antenna 25 as an RF excitation unit for exciting the gas for secondary reaction plasma to generate the secondary reaction plasma 21. In the embodiment, hydrogen chloride (HCl) gas is used as the gas for secondary reaction plasma, and a coil is used as the RF antenna 25.

In the embodiment, the target supply unit 4 heats and melts solid tin (Sn), and supplies the tin target 3 in a form of a solid state or liquid droplets into the vacuum chamber 2. As the drive laser 6, a carbon dioxide ($CO_2$) pulse laser that can generate light having a relatively long wavelength is used. For example, the output of the carbon dioxide pulse laser is 20 kW, the pulse repetition frequency is 100 kHz, and the pulse width is 20 ns. However, in the present invention, the kinds of target materials and laser light sources are not limited to these and various kinds of target materials and laser light sources may be used.

The excitation laser beam 5 is introduced into the vacuum chamber 2 through an entrance window 14 provided in the vacuum chamber 2. The laser beam focusing optics 7 includes at least one lens and/or at least one mirror. The laser beam focusing optics 7 may be located inside the vacuum chamber 2 as shown in FIG. 1, or outside the vacuum chamber 2.

The EUV collector mirror 10 is a collective optics for collecting light by selectively reflecting a predetermined wavelength component (e.g., EUV light near 13.5 nm) of the various wavelength components radiated from the target plasma 8. The EUV collector mirror 10 has a concave reflection surface, and a multilayer film of molybdenum (Mo) and silicon (Si) for selectively reflecting EUV light having a wavelength near 13.5 nm is formed on the reflection surface and the reflectance of EUV light of about 60% is obtained.

The EUV light 9 radiated from the target plasma 8 is reflected by the EUV collector mirror 10 and guided out to an exposure unit through an intermediate focusing point (IF). An SPF (spectral purity filter) may be provided at the upstream or downstream of the intermediate focusing point (IF). The SPF removes unwanted light (light having longer wavelengths than that of EUV light, e.g., ultraviolet light, visible light, infrared light, and so on) of the light radiated from the target plasma 8 and transmits only desired light, for example, the EUV light having a wavelength of 13.5 nm. Further, a gate valve 19 for separating the exposure unit and the EUV light source apparatus 1 may be provided for maintenance. In FIG. 1, the EUV light generated from the target plasma 8 is reflected leftward by the EUV collector mirror 10, focused on the EUV intermediate focusing point (IF), and then, outputted to the equipment unit.

The tin target 3 supplied from the target supply unit 4 is excited by the excitation laser beam 5, and part of the target becomes the target plasma 8. The target plasma 8 contains electrons, polyvalent positive tin ions ($Sn^+$), and tin radicals ($Sn^*$). Among them, the positive tin ions ($Sn^+$) are subjected to Lorentz force ($F=qv \times B$) when the magnetic field is provided, and move in a direction of lines of magnetic force while twining around the lines of magnetic force. Here, "q" is charge of a charged particle, "v" is a velocity of the charged particle, and "B" is magnetic flux density.

Thereby, the movement of ions in the direction orthogonal to the direction of the lines of magnetic force is restricted and the ions are confined by the magnetic field. Since the positive tin ions ($Sn^+$) are confined by the magnetic field, in the case where optical element such as the EUV collector mirror 10, the entrance window 14, the SPF (not shown), an entrance window of an optical sensor (not shown) is provided in the direction orthogonal to the direction of the lines of magnetic force, the amount of the positive tin ions ($Sn^+$) attaching to the surfaces of the optical element can be reduced.

However, the generated positive tin ions ($Sn^+$) easily recombine with electrons, and part of the positive tin ions ($Sn^+$) may recombine with electrons and be neutralized, and attach to the optical elements as neutral tin debris (Sn) without being constrained by the magnetic field. Further, it is difficult to ionize all target materials by the target excitation laser, and part of the target materials may attach to the optical elements as neutral particles without being constrained by the magnetic field. Furthermore, the tin radicals ($Sn^*$) generated from the plasma are also neutral, and may attach to the optical elements without being constrained by the magnetic field.

Accordingly, in the embodiment, the hydrogen chloride (HCl) gas is supplied near the target within the vacuum chamber 2 by the gas supply unit 23, and a radio-frequency electric field (e.g., 13.56 MHz) is applied to the hydrogen chloride gas by the RF antenna 25. By exciting the neutral tin (Sn), tin radicals ($Sn^*$), and the hydrogen chloride (HCl) gas around the region where the plasma of the tin target material (target plasma 8) is generated, the secondary reaction plasma (RF plasma) 21 is generated.

In the secondary reaction plasma 21, the neutral tin (Sn) and/or tin radicals ($Sn^*$), that have not been excited until being ionized by the excitation laser beam 5, are ionized or the neutral tin (Sn), that has been excited to be the positive tin ions ($Sn^+$) by the excitation laser beam 5 and then recombined with electrons to be neutralized, is ionized. The positive tin ions ($Sn^+$) ionized in the secondary reaction plasma 21 are constrained by the magnetic field, and ejected by the evacuating pump 20 provided on extended lines of the lines of magnetic force.

Further, in the secondary reaction plasma 21, gaseous products of tin hydride ($SnH_4$), tin chloride ($SnCl_4$), and so on are generated by chemical reaction, and those gaseous products are also ejected by the evacuating pump 20. Thereby, the attachment of debris of neutral tin (Sn) and so on to the optical elements, which attachment was impossible to be prevented only by the conventional magnetic confinement system, can be effectively reduced. Further, the same effect may be obtained by exciting helicon wave plasma by using a radio-frequency electric field and a magnetic field so as to generate the secondary reaction plasma 21.

In order to prevent the attachment of debris of tin (Sn), etc. to the optical elements, it is effective that the ions constrained by the magnetic field are efficiently attracted to the evacuating pump 20 and efficiently ejected by the evacuating pump 20. For the purpose, when a conductive mesh 27 is provided near the inlet of the evacuating pump 20, a bias is applied to the mesh 27 by using an RF power supply 29, and current is blocked by a blocking capacitor 28, a cathode fall (sheath) occurs on the surface of the mesh 27. Thereby, the mesh 27 is negatively charged and the positive ions such as the positive tin ions ($Sn^+$) are attracted through the mesh 27 to the evacuating pump 20 and efficiently ejected by the evacuating pump 20. Alternatively, by providing the magnetic coil 17 configured such that the magnetic flux density at the evacuating pump 20 side is lower, the ions constrained by the Lorentz force gradually move to the evacuating pump 20 side and are efficiently ejected by the evacuating pump 20.

As the gas used for generation of the secondary reaction plasma 21, argon gas (Ar), nitrogen gas ($N_2$), hydrogen gas ($H_2$), halogen gas ($F_2$, $Cl_2$, $Br_2$, $I_2$), halogenated hydrogen gas (HF, HCl, HBr, HI), or a mixed gas containing at least two of them is preferable. Especially, the hydrogen gas ($H_2$), chlorine gas ($Cl_2$), bromine gas ($Br_2$), hydrogen chloride gas (HCl), and hydrogen bromide gas (HBr) react with tin (Sn) in the secondary reaction plasma 21, and generate reaction products at low vapor pressure such as tin hydride ($SnH_4$), tin chloride ($SnCl_4$), tin bromide ($SnBr_4$), and so on, and those reaction products are gasified in the vacuum chamber 2. The gasified reaction products are easily ejected from the vacuum chamber 2 by the evacuating pump 20.

Here, by coating the surface of the EUV collector mirror 10 with ruthenium (Ru), silicon carbide (SiC), carbon (C), silicon dioxide ($SiO_2$), or ruthenium oxide ($RuO_2$) as a protective coating film 12, the corrosion of the surface of the EUV collector mirror 10 by the gas used for generation of the secondary reaction plasma 21, especially, the halogen gas or halogenated hydrogen gas can be prevented without significant reduction of the reflectance of EUV light. In this case, if the gas used for generation of the secondary reaction plasma 21 is supplied around the EUV collector mirror 10, the surface of the EUV collector mirror 10 is hardly corroded by the gas.

Next, the second embodiment of the present invention will be explained.

Figure 2:
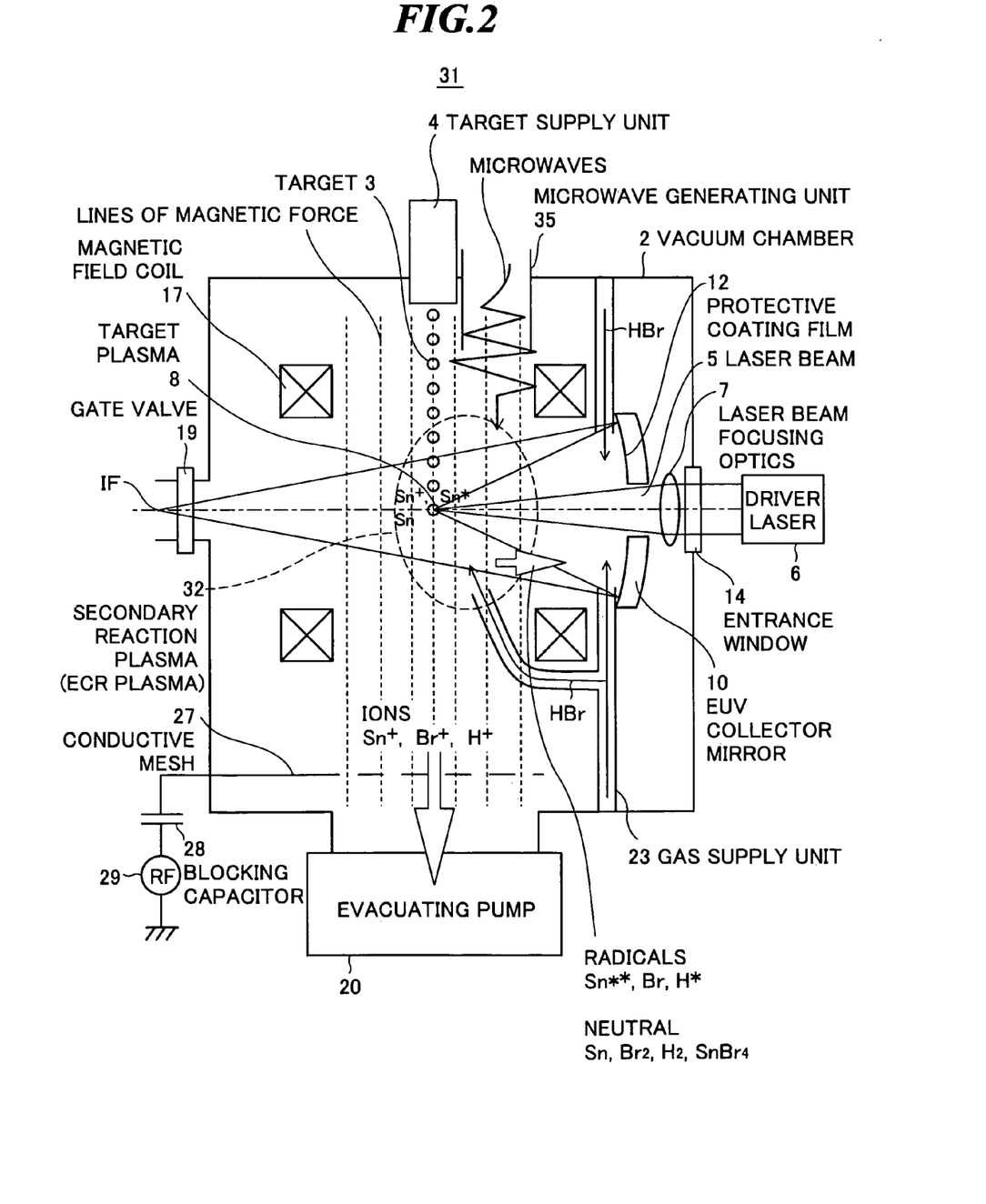
FIG. 2 shows an internal structure of an EUV light source apparatus according to the second embodiment of the present invention.

FIG. 2 shows an internal structure of an EUV light source apparatus according to the second embodiment of the present invention. As shown in FIG. 2, the EUV light source apparatus 31 includes the same configuration as that of the EUV light source apparatus according to the first embodiment, however, excites a secondary reaction plasma 32 by using a magnetic field and microwaves in place of the radio-frequency electric field. The magnetic field is generated by the magnetic field coil 17, for example, and the microwaves are generated by a microwave generating unit (excitation unit) 35 for exciting a gas by generating microwaves.

Here, the case of using hydrogen bromide gas (HBr) as the secondary reaction plasma 32 will be explained as an example. By the influence of the magnetic field and the microwaves, the electrons in the hydrogen bromide gas molecules are accelerated by cyclotron resonance, the accelerated electrons collide with the gas, and the gas is excited. Thereby, electron cyclotron resonance (ECR) plasma is generated. For example, when the intensity of the magnetic field is 0.5 T, the ECR plasma is efficiently generated by the microwaves having a frequency of about 14 GHz. The same effect as that in the first embodiment of the present invention is also obtained in the EUV light source apparatus according to the second embodiment of the present invention.

Next, the third embodiment of the present invention will be explained.

Figure 3:
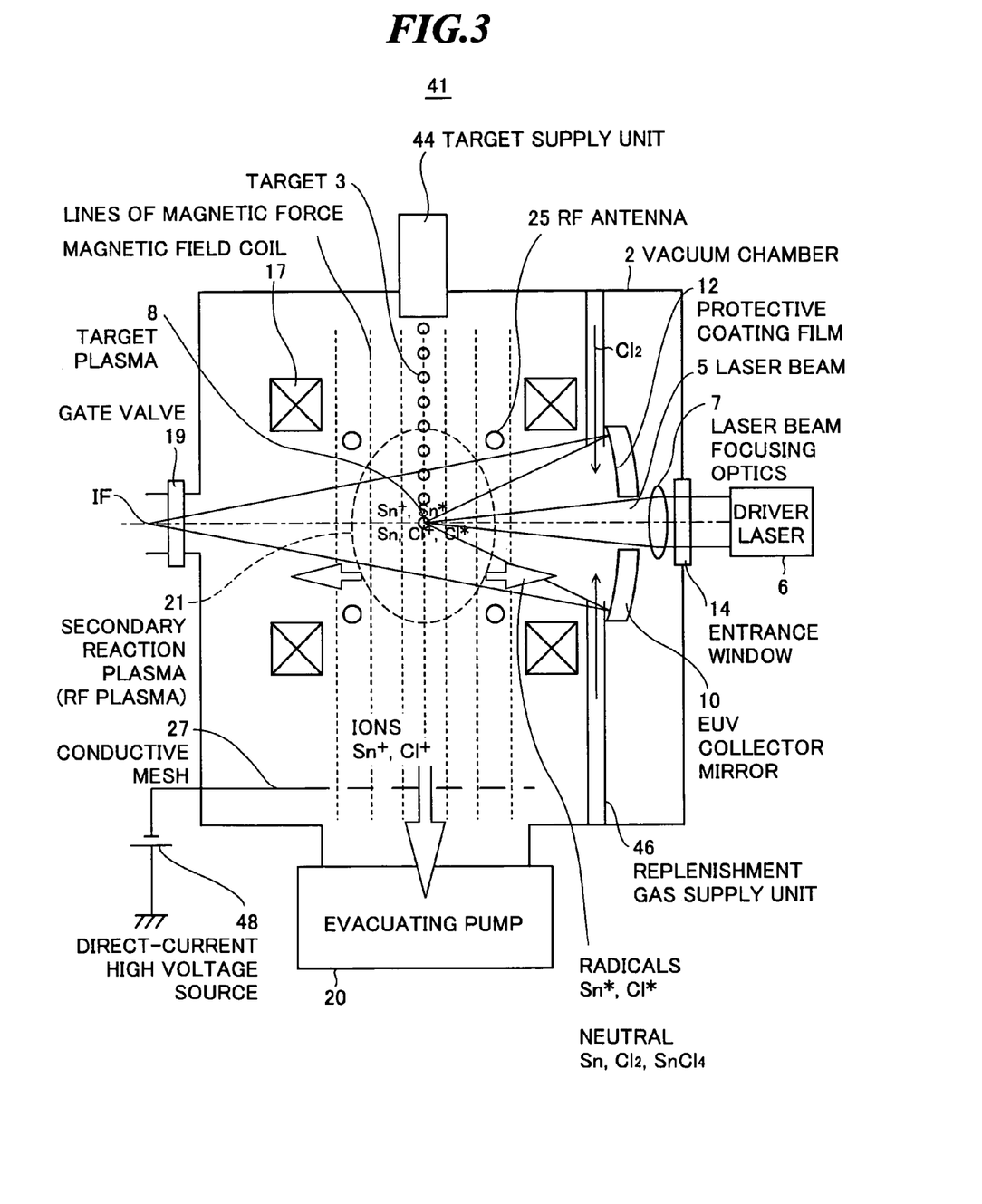
FIG. 3 shows an internal structure of an EUV light source apparatus according to the third embodiment of the present invention.

FIG. 3 shows an internal structure of an EUV light source apparatus according to the third embodiment of the present invention. As shown in FIG. 3, the EUV light source apparatus 41 includes a target supply unit 44 that can liquefy (or freeze and solidify) tin hydride ($SnH_4$) or halogenated tin ($SnCl_4$, $SnBr_4$) as disclosed in JP-P2006-210157A, for example. Further, the EUV light source apparatus shown in FIG. 3 may include a replenishment gas supply unit 46.

As below, the case where the target supply unit 44 supplies the liquefied (or frozen and solidified) tin chloride ($SnCl_4$) as a target will be explained as an example. The liquefied (or frozen and solidified) tin chloride ($SnCl_4$) supplied from the target supply unit 44 is excited by the excitation laser beam 5, and thereby, the target plasma 8 for generation of EUV light and the secondary reaction plasma 21 are generated at the same time.

However, in practice, only by the excitation with the excitation laser beam 5, it is difficult to continuously generate the secondary reaction plasma 21 because the energy necessary for continuous excitation of the secondary reaction plasma 21 becomes insufficient. Accordingly, by providing the RF (radio frequency) excitation unit used in the first embodiment or the microwave generating unit used in the second embodiment as well, the secondary reaction plasma 21 can stably be generated.

In the secondary reaction plasma 21, the neutral tin (Sn) and/or tin radicals ($Sn^*$), that have not been excited until being ionized by the excitation laser beam 5, are ionized or the neutral tin (Sn), that has been excited to be the positive tin ions ($Sn^+$) by the excitation laser beam 5 and then recombined with electrons to be neutralized, is ionized. The positive tin ions ($Sn^+$) ionized in the secondary reaction plasma 21 are constrained by the magnetic field, and ejected by the evacuating pump 20 provided on extended lines of the lines of magnetic force. Further, in the secondary reaction plasma 21, gaseous products of tin chloride ($SnCl_4$) and so on are generated by chemical reaction, and those gaseous products are also ejected by the evacuating pump 20. Thereby, the attachment of debris of neutral tin (Sn) to the optical elements, which attachment was impossible to be prevented only by the conventional magnetic confinement system, can be effectively reduced.

Furthermore, in order to continuously generate the secondary reaction plasma 21, the EUV light source apparatus 41 may include the replenishment gas supply unit 46, and the replenishment gas supply unit 46 may supply chlorine gas ($Cl_2$), hydrogen chloride gas (HCl), and/or hydrogen gas ($H_2$) as a replenishment gas for secondary reaction plasma into the vacuum chamber 2.

In addition, a conductive mesh 27 may be provided near the inlet of the evacuating pump 20 in the EUV light source apparatus 41. A direct-current high voltage is applied as a bias to the conductive mesh 27 by using direct-current high voltage source 48, for example, and thereby, the conductive mesh 27 is negatively charged and the positive ions such as the positive tin ions ($Sn^+$) constrained by the magnetic field are attracted to the inlet of the evacuating pump 20 and efficiently ejected from the evacuating pump 20.

In the EUV light source apparatuses according to the first to third embodiments of the present invention, the case where the ion confinement effect by the magnetic field, the ionization promotion effect by the secondary reaction plasma, and the generation promotion effect of gaseous reaction products are utilized in combination has been explained. However, in the EUV light source apparatuses according to the first to third embodiments of the present invention, without providing the magnetic field generating unit, only with the secondary reaction plasma, the reaction products having a low vapor pressure to be gasified within the vacuum chamber such as tin hydride ($SnH_4$), tin chloride ($SnCl_4$), tin bromide ($SnBr_4$), and so on can be generated, and the effect that the gasified reaction products are ejected to the outside of the vacuum chamber 2 without attaching to the optical elements within the vacuum chamber 2 is obtained.

Next, the fourth embodiment of the present invention will be explained.

Figure 4:
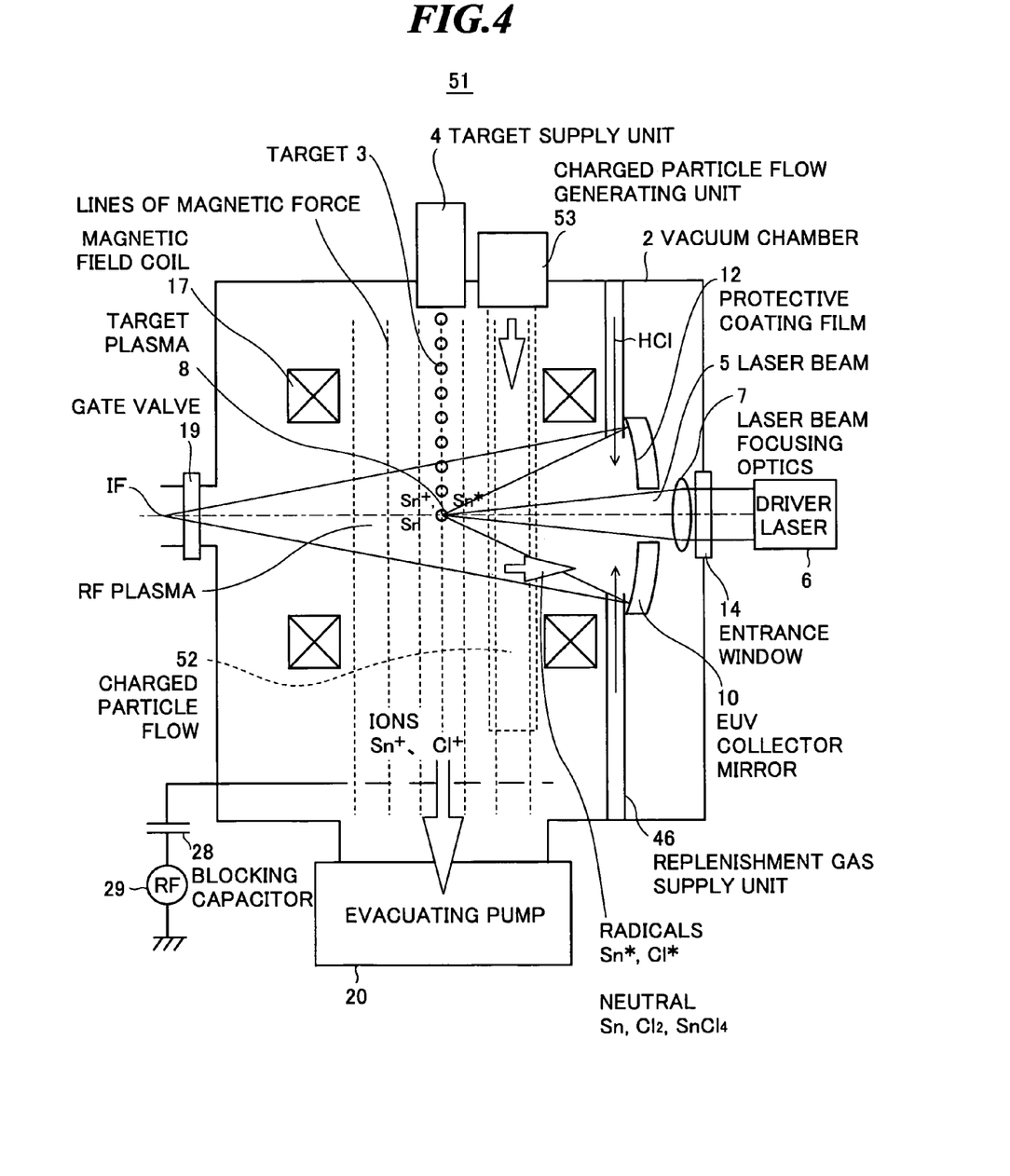
FIG. 4 shows an internal structure of an EUV light source apparatus according to the fourth embodiment of the present invention.

FIG. 4 shows an internal structure of an EUV light source apparatus according to the fourth embodiment of the present invention. As shown in FIG. 4, the EUV light source apparatus 51 includes a charged particle flow generating unit 53 for flowing a charged particle flow 52 in a curtain form along lines of magnetic force of a magnetic field that confines charged particles contained in debris.

For example, the charged particle flow generating unit 53 generates RF (radio frequency) excitation plasma by exciting a gas with a radio-frequency electric field, or generates ECR (electron cyclotron resonance) wave excitation plasma by exciting a gas with a magnetic field and microwaves, or generates HWP (helicon wave plasma) by applying a radio-frequency electric field and a magnetic field to a gas. The charged particle flow generating unit 53 extracts ions from the plasma and generates an ion flow along the lines of magnetic force.

As the gas used in the charged particle flow generating unit 53, argon gas (Ar), nitrogen gas ($N_2$), hydrogen gas ($H_2$), halogen gas ($F_2$, $Cl_2$, $Br_2$, $I_2$), halogenated hydrogen gas (HF, HCl, HBr, HI), or a mixed gas containing at least two of them is preferable.

As below, the case of using an ion source unit (ion gun) for generating chlorine ($Cl^+$) ions as the charged particle flow generating unit 53 will be explained. The curtain flow of the chlorine ions generated by the charged particle flow generating unit 53 flows between the target plasma 8 and the EUV collector mirror 10 as the charged particle flow. The neutral tin debris emitted from the excited target plasma 8 are trapped by the ion curtain flow.

In the ion curtain flow, the neutral tin (Sn) and/or tin radicals ($Sn^*$) are ionized by charge exchange with chlorine ions, or the neutral tin (Sn), that has been excited to be the positive tin ions ($Sn^+$) and then recombined with electrons to be neutralized, are ionized by charge exchange with chlorine ions. Thus ionized positive tin ions ($Sn^+$) are constrained by the magnetic field, and ejected by the evacuating pump 20 provided on extended lines of the lines of magnetic force. Further, in the ion curtain flow, the gaseous products of tin chloride ($SnCl_4$) and so on are generated as chemical reaction products of the neutral tin debris emitted from the excited target plasma 8 and the chlorine ions, and those gaseous products are also ejected by the evacuating pump 20.

Alternatively, a plasma gun may be used as the charged particle flow generating unit 53 and generate a plasma flow such that the generated plasma flow may be introduced as the charged particle flow 52 into the vacuum chamber 2. Further, the particles generated by recombination of the charged particle flow 52 within the vacuum chamber 2 may be ionized again by application of radio-frequency or microwaves. Furthermore, the replenishment gas for generation of secondary reaction plasma may be introduced into the vacuum chamber 2 by the replenishment gas supply unit 46, the secondary reaction plasma is generated by application of radio-frequency or microwaves, and thereby, the effect of charged particle flow 52 generated by the charged particle flow generating unit 53 and the effect of the secondary reaction plasma generated by the radio-frequency or microwaves may be used in combination.

The invention claimed is:

1. An extreme ultra violet light source apparatus for generating extreme ultra violet light by applying a laser beam to a target material, said apparatus comprising:

a chamber in which the extreme ultra violet light is generated;

a target supply unit configured to supply the target material into said chamber;

a driver laser configured to apply the laser beam to the target material supplied from the target supply unit to generate plasma;

a collector mirror provided within said chamber, and configured to collect the extreme ultra violet light from the plasma;

a charged particle flow generating unit configured to externally supply a flow of charged particles into the chamber and perform charge exchange between the charged particles and electrically neutral debris from the plasma to charge the debris; and a magnetic field generating unit configured to generate a magnetic field that confines the charged debris.

2. The extreme ultra violet light source apparatus according to claim 1, said charged particle flow generating unit generates one of RF (radio frequency) excitation plasma, ECR (electron cyclotron resonance) wave excitation plasma, and HWP (helicon wave plasma), and extracts ions from the generated plasma and generates an ion flow along lines of magnetic force.

3. The extreme ultra violet light source apparatus according to claim 2, said charged particle flow generating unit excites at least one of gases consisting of argon gas (Ar), nitrogen gas ($N_2$), hydrogen gas ($H_2$), fluorine gas ($F_2$), chlorine gas ($Cl_2$), bromine gas ($Br_2$), iodine gas ($I_2$), hydrogen fluoride gas (HF), hydrogen chloride gas (HCl), hydrogen bromide gas (HBr), and hydrogen iodide (HI).

4. The extreme ultra violet light source apparatus according to claim 3, further comprising an exhaust unit configured to exhaust the at least one of the gases.

5. The extreme ultra violet light source apparatus according to claim 1, wherein a surface of said collector mirror is coated with a protective coating film containing at least one of ruthenium (Ru), silicon carbide (SiC), carbon (C), silicon dioxide ($SiO_2$), and ruthenium oxide ($RuO_2$).

6. An extreme ultra violet light source apparatus comprising:

a chamber;

a target supply unit configured to supply a target material, which is tin, into the chamber;

a gas supply unit configured to supply a hydrogen gas into the chamber;

a $CO_2$ laser configured to apply a laser beam to the target material supplied from the target supply unit to generate first plasma from which extreme ultra violet (EUV) light is emitted, and excite the hydrogen gas and an electrically neutral tin both existing in the chamber to generate second plasma which makes the hydrogen gas and the tin chemically react with each other;

a collector mirror provided in the chamber and configured to collect the EUV light from the first plasma;

a magnetic field generating unit configured to generate a magnetic field to confine charged tin existing in the chamber; and an exhaust unit configured to exhaust at least the hydrogen gas from the chamber.

7. The extreme ultra violet light source apparatus according to claim 6, wherein a surface of said collector mirror is coated with a protective coating film containing at least one of ruthenium (Ru), silicon carbide (SiC), carbon (C), silicon dioxide ($SiO_2$), and ruthenium oxide ($RuO_2$).

8. The extreme ultra violet light source apparatus according to claim 6, wherein the electrically neutral tin and the charged tin are released from the first and second plasma.

9. The extreme ultra violet light source apparatus according to claim 6, wherein:

the second plasma releases a gaseous product produced from the hydrogen gas and tin, and the exhaust unit exhausts the gaseous product from the chamber.

10. The extreme ultra violet light source apparatus according to claim 9, wherein the gaseous product is $SnH_4$.

11. The extreme ultra violet light source apparatus according to claim 6, further comprising:

a conductive mesh provided near an inlet of the exhaust unit; and a power supply configured to apply a voltage to the conductive mesh.

12. The extreme ultra violet light source apparatus according to claim 11, further comprising a blocking capacitor electrically connected between the conductive mesh and the power supply.

* * * * *